US006107908A

United States Patent [19]

Santa Cruz et al.

[11] Patent Number: 6,107,908

[45] Date of Patent: Aug. 22, 2000

[54] BLOWN FUSE COMMUTATOR STRIP AND METHOD OF USE

[76] Inventors: Cathy D. Santa Cruz, 7630 Tholl Dr., Reno, Nev. 89506; Galen J. May, 2251 Cielo Vista Dr., Sparks, Nev. 89436

[21] Appl. No.: 09/327,275

[22] Filed: Jun. 7, 1999

Related U.S. Application Data

[60] Provisional application No. 60/096,864, Aug. 17, 1998.

[51] Int. Cl.[7] .......................... H01H 85/30; H01H 85/32; H01H 85/34; G01R 31/07

[52] U.S. Cl. .......................... 337/241; 337/265; 337/242; 337/266; 81/3.8; 324/507; 340/639

[58] Field of Search .................................... 337/241, 242, 337/245, 265, 266; 439/490, 491, 622; 324/507, 550, 691; 340/38, 639; 361/835; 81/3.8; 116/202

[56] References Cited

U.S. PATENT DOCUMENTS

| | | | |
|---|---|---|---|
| 1,951,308 | 3/1934 | La Mar | 337/242 |
| 2,062,669 | 12/1936 | La Mar | 337/242 |
| 2,071,843 | 2/1937 | Korn | 337/242 |
| 2,128,418 | 8/1938 | La Mar | 337/242 |
| 2,175,987 | 10/1939 | Dodge | 337/242 |
| 2,321,271 | 6/1943 | Bahlke et al. | 337/215 |
| 2,343,676 | 3/1944 | La Mar | 337/242 |
| 2,492,302 | 12/1949 | Linton | 337/242 |
| 3,794,948 | 2/1974 | Linton et al. | 337/242 |
| 4,475,283 | 10/1984 | Olson et al. | 29/720 |
| 4,514,723 | 4/1985 | Leal | 340/638 |
| 4,772,219 | 9/1988 | Falchetti | 439/490 |
| 5,300,913 | 4/1994 | Linton | 337/242 |
| 5,701,118 | 12/1997 | Hull et al. | 340/638 |
| 5,874,884 | 2/1999 | Hull et al. | 337/241 |

FOREIGN PATENT DOCUMENTS

| | | | |
|---|---|---|---|
| 0313709A1 | 5/1989 | European Pat. Off. | H01H 85/32 |
| 0828279A1 | 3/1998 | European Pat. Off. | H01H 85/30 |
| 3734516A1 | 4/1989 | Germany | H01H 73/14 |
| 2063589 | 6/1981 | United Kingdom | H01H 85/30 |

*Primary Examiner*—Leo P. Picard
*Assistant Examiner*—Anatoly Vortman

[57] ABSTRACT

A blown fuse commutator strip which is removably attachable to a pre existing plug-in type fuse, with the commutator strip having an indicator thereon which will notify the user that the fuse has blown and needs replacing.

6 Claims, 2 Drawing Sheets

FIG. 1
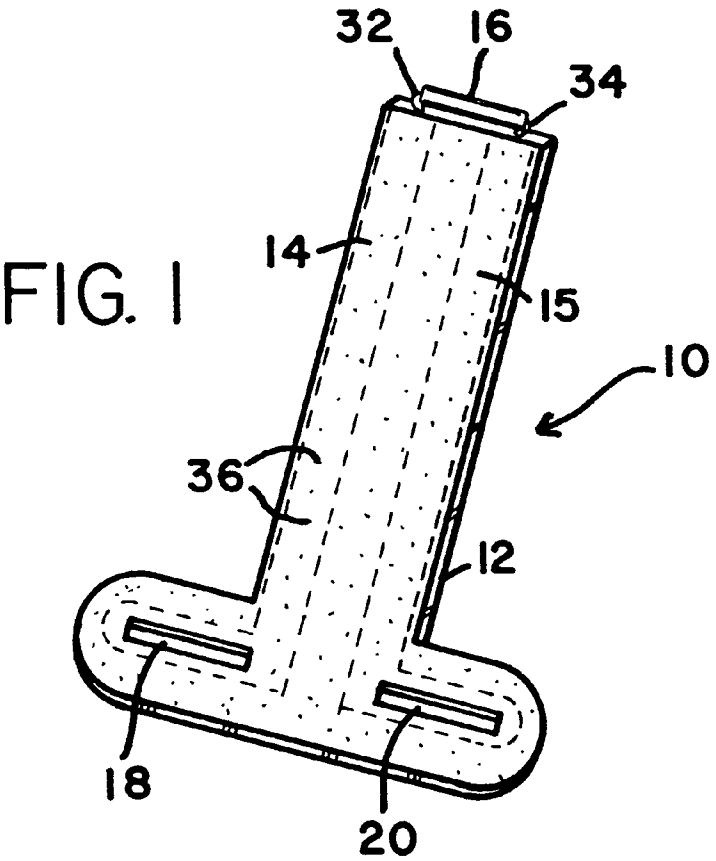
FIG. 2
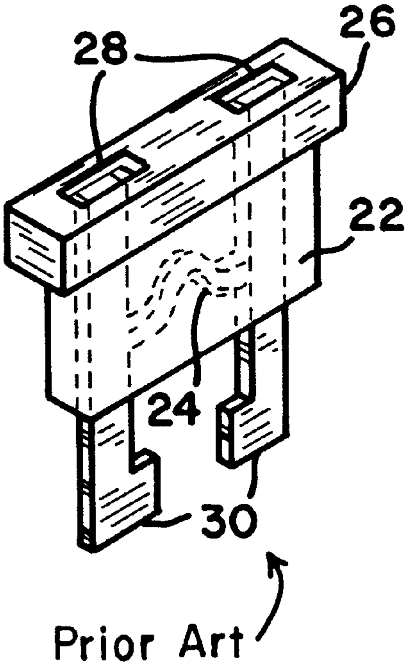
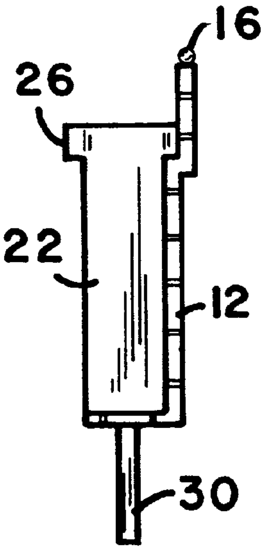
FIG. 3

BLOWN FUSE COMMUTATOR STRIP AND METHOD OF USE

This application corresponds to our Provisional patent application Ser. No. 60/096,864 filed on Aug. 17, 1998.

FIELD OF THE INVENTION

This invention relates to blown fuse indicators but more particularly relates to a removable commutator strip containing a light source therein with appropriate circuitry, and when attached to a fuse, the light source will illuminate when the fuse has blown, so as to notify the user thereof.

BACKGROUND OF THE INVENTION

It is well known within the field that when a fuse has blown, it can be quite time consuming and difficult to locate the fuse, especially under circumstances during the night, or in the dark where no exterior lighting is provided. This situation is more often encountered such as when one is within a vehicle and the fuse block/box is positioned within the glove box or under the dash. In such a situation it can be extremely difficult and irritating when one is searching for the blown fuse which must be replaced and they simply can't see the fuses and/or the fuses are not easily accessible.

It is therefore contended by the applicants that it would be most advantageous and desirable to provide an efficient, easily installed commutator strip having a light source therein which when attached to a plug-in type fuse, in combination within an electrical circuit, will illuminate the light source when a fuse has blown. Thus, would eliminate guess work for the user as well as save time and wasted energy.

The above noted situation has been addressed within the prior art and attempts have been made to resolve the problems associated therewith, but most attempts prove to be much to costly and to complicated for the average user to install, and/or is simply inefficient.

The following are exemplary prior art references relating to blown fuse indicators such as found within the field of the present invention. U.S. Pat. No. 5,311,139 teaches a "FUSE CHECKER FOR TESTING INTEGRITY OF A MINIATURE, PLUG-IN FUSE WHILE THE FUSE IS INSTALLED IN AN ELECTRICAL CIRCUIT". This reference is functional for its intended purpose which is to "test" the condition of a fuse. The test is performed by using a checker which includes a housing from which extends a pair of parallel contact points adapted for engagement with terminal tabs that lie within terminal access openings within a plug-in type fuse housing and in practice, the user must manually insert the checker and apply constant pressure upon the terminal tabs while the test is performed and if a fuse is blown, one of two LED's located on the checker housing will illuminate, and if the fuse is not blown, both LED's on the checker will illuminate. This checker device is not designed to be used and/or installed on a permanent basis and is only usable for performing the above described test. This reference is therefore limited in use and could not be installed on a permanent basis, as can the present invention.

Various types of spring clips have been taught for securing a blown fuse light indicator to a cartridge fuse as indicated by U.S. Pat. Nos. 3,432,789 and 3,457,535. However, these references have addressed only cartridge type fuse holders and in each case additional limiting resistors are required and/or a separate plug is required, and each would not be attachable or functional if used on a plug-in type fuse. It is common knowledge that in many cases, the plug-in type fuse has become the fuse housing of choice, such as found within most fuse boxes used within most modern day vehicles. Therefore, it is contended by the applicants that a need exists for substantially an commutator strip containing a light source and circuitry which in combination will allow the light source, such as an LED located within the commutator strip, to indicate that the fuse within the circuit has blown.

It is to be noted that within our issued U.S. Pat. No. 5,701,118, (by the same inventors) we provide a similar device which is an indicator cap which is removably attachable to a prior art plug-in type fuse, and the cap having an indicator light for signaling that a fuse has blown so as to notify a user of the blown condition of the fuse. However, this invention is similar in function but does not provide the overall unusual results and does not include an commutator strip which is removably attachable to a plug-in type fuse.

SUMMARY OF THE INVENTION

The present invention is substantially a blown fuse commutator strip having an internal copper filament and a light source therein. In the preferred embodiment, the commutator strip is removably attachable to a prior art plug-in type fuse housing.

The fuse plug provides a first and a second exposed terminal tab extending therefrom, with the commutator strip having a first and a second terminal tab opening. With each opening being of a shape and size to slidably receive one of the terminal tabs therein. Therefore, the fuse plug, commutator strip and associated circuitry (such as a circuit which is commonly found within most vehicle fuse block/boxes with the circuit being energized by a power source, such as a battery) in combination allow the light source to illuminate when the fuse has blown.

It is therefore a primary object of the present invention to provide an commutator strip containing an internal copper filament and a light source therein, with the commutator strip being removably attachable to an existing prior art plug-in type fuse housing. Thus, the fuse plug, commutator strip, light source and appropriate circuitry in combination, allows the light source to illuminate when a fuse has blown and the light source will not illuminate when the fuse has not blown.

It is another object of the present invention to provide a light source of engineering choice, such as an LED indicator light, or the like.

It is another important object of the present invention to provide a commutator strip which may be produced in a variety of colors which correspond to the various types of colored fuse housings, with the color of each representing and indicating amperage thereof.

Still another object of the present invention is to provide a removable commutator strip in combination with appropriate circuitry which causes the unusual results of having a light source be illuminated when the fuse has blown.

Yet another object of the present invention is to provide a method of use for the present invention.

Also another object of the present invention is to provide a commutator strip which may be removably attached to an existing prior art plug-in type fuse by any suitable attachment means of engineering choice, such as an adhesive, or the like.

Yet another object of the present invention is to provide a commutator strip which can be sold separately from the fuse plug, or sold in combination.

Also another object of the present invention is to manufacture and sell multiple commutator strips in combination within the same packaging, or they may be manufactured and sold separately.

Other objects and advantages will be seen when taken into consideration with the following drawings and specification.

BRIEF DESCRIPTION OF THE DRAWINGS

FIG. 1 is substantially a perspective view of the present invention.

FIG. 2 is substantially a perspective view of a prior art fuse plug.

FIGS. 3 and 4 are substantially a side view of the present invention when attached to a prior art fuse plug.

DETAILED DESCRIPTION OF THE DRAWINGS

Figure 4:
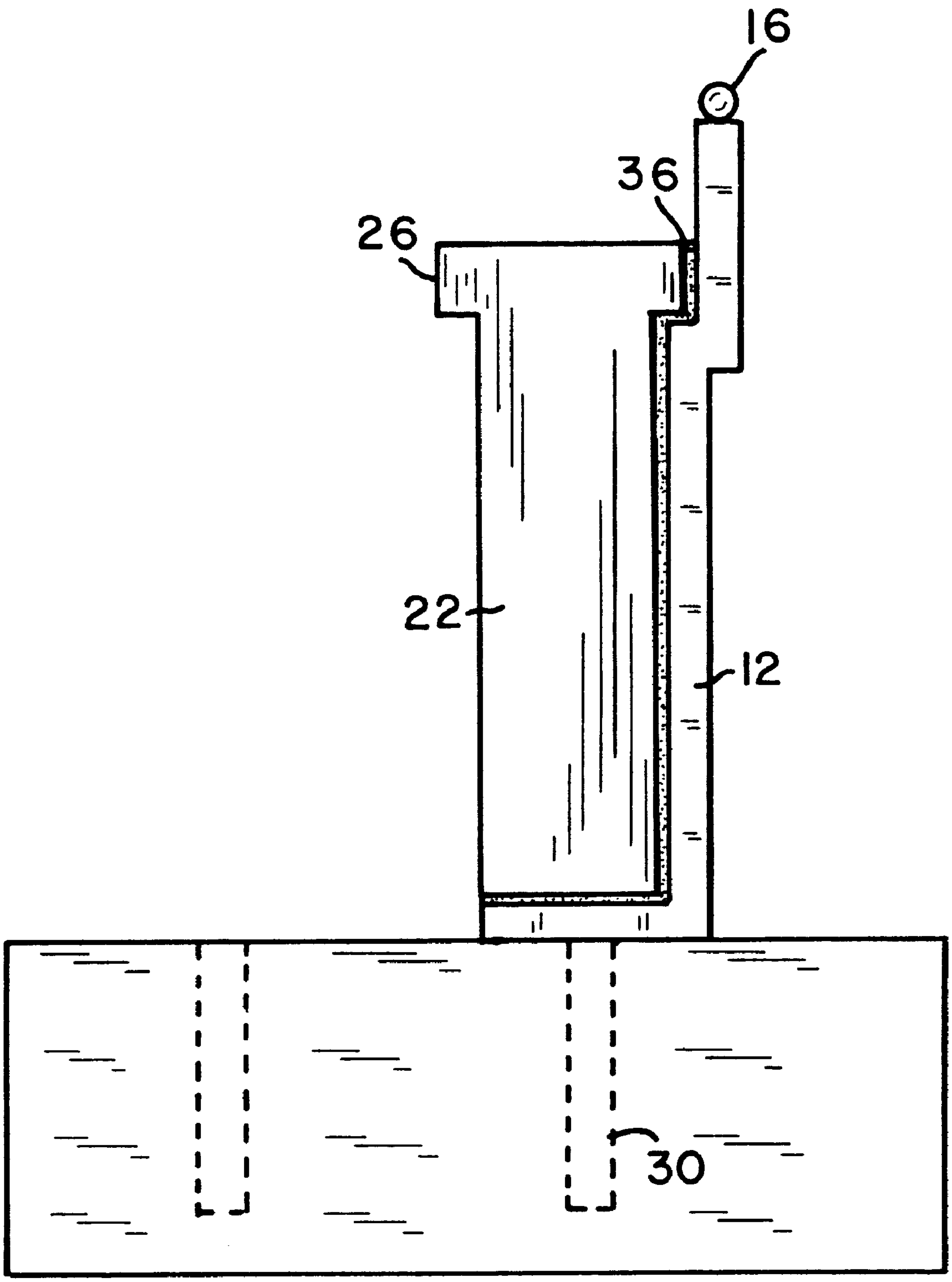

Referring now in detail to the drawings wherein like numerals represent like elements throughout the various views. As illustrated in FIG. 1, (arrow 10) represents an overview of the preferred embodiment for the present invention which is substantially a commutator strip (12) containing a first and a second embedded internal copper filament (14 & 15), a light source (16) thereon, and a first and a second terminal tab opening (18 & 20), with the commutator strip (12) being removably attachable to an existing prior art plug-in type fuse housing (22).

Fuse housing (22) containing a fusible link (24) therein. Housing (22) being of colored plastic material, with the color being indicative of the current rating of the fuse so as to signify amperage, and includes a generally rectangular top wall (26) that has a pair of longitudinally spaced terminal access openings (28) that extend through top wall (26) into the interior of fuse housing (22).

Positioned within housing (22) and extending from substantially a bottom portion thereof are first and second parallel, spaced, blade-type fuse terminal tabs (30) which are adapted to be received within a correspondingly spaced pair of fuse receptacle contacts within a plastic fuse block, or the like (not shown). Fuse terminal tabs (30) are of a shape and size to allow for them to extend outwardly from the lower end of housing (22), and also to extend into housing (22) to be received and tightly held by the housing by suitable terminal anchoring arrangements (not shown). Extending between each of fuse terminal tabs (30) within fuse housing (22) is a fusible link (24) which is made from a material that permits the passage between fuse terminal tabs (30) of currents less than the rated current value of the fuse, and the material will melt or separate if a current greater than the rated current value of the fuse passes through the fusible link (24).

It is to be understood that commutator strip (12) can be made from substantially any suitable material of engineering choice, such as plastic or the like. Furthermore, commutator strip (12) is of a shape and size to allow housing (22) to be easily inserted into a fuse block with commutator strip (12) in combination.

It is to be also understood that commutator strip (12) can be removably attached to housing (22) by any suitable attachment means of engineering choice. For example, commutator strip (12) may be attached by a spray-on adhesive (36), or the like. Also, commutator strip (12) is substantially flexible so as to allow commutator strip (12) to be manually molded or folded into a shape that will allow commutator strip to fit in substantially a flush manner against housing (22).

It is to be understood that first and second embedded internal copper filaments (14 & 15) may be embedded into commutator strip (12) by any suitable means of engineering choice, such as integrally formed at the point of manufacture, similar to production of solid state circuitry, or the like.

In reference to light source (16), it is to be understood that any suitable light source of engineering choice may be used, such as a bulb, an LED, or the like. Light source (16) includes means to electrically communicate with copper filaments (14 & 15), such as a first and a second lead (32 & 34), or the like. Whereby, first lead (32) is electrically connected to first copper filament (14) and second lead (34) is electrically connected to second copper filament (15). Also, first lead (32) can be fixedly attached to first copper filament (14) and second lead (34) can be fixedly attached to second copper filament (15) by any suitable attachment means of engineering choice, such as by soldering or the like.

It is to be understood that any suitable conductive material of engineering choice can be used to make each filament (14 & 15), as copper is only exemplary in the instant invention.

It is to be further understood that any suitable indicator other than a light source, such as a buzzer, or the like, may be used in place of light source (16) if so desired.

It is to be noted that appropriate circuitry is not taught within the present invention as such circuitry is clearly taught within our previous issued U.S. Pat. No. 5,701,118. Thus, it is to be understood such circuitry is included within the present invention but not claimed.

It will now be seen that we have herein provided a blown fuse commutator strip (12) that is easily attachable to a prior art fuse housing (22), by slidably inserting tabs (30) into each first and a second terminal tab opening (18 & 20) and folding commutator strip (12) until it assumes substantially a flush position against housing (22). Whereby, when housing (22) with attached commutator strip (12) is installed within a typical fuse block (not shown) in the usual manner, each of the components namely, prior art housing (22) with associated circuitry, fuse block (not shown), and commutator strip (12) in combination are in electrical communication. Thus, when fuse (24) within housing (22) is functioning properly, light source (16) will not illuminate, and when fuse (24) is not functioning or becomes blown, light source (16) will illuminate, so as to notify a user which fuse needs to be replaced.

It is to be further noted we herein also provide a method of use for the present invention as follows:

A method of using and attaching a blown fuse commutator strip to a prior art fuse comprising of the following steps:

a. removing a prior art plug-in type fuse housing (22) from a fuse box;

b. slidably inserting both terminal tabs (30) located on fuse housing (22) into a first and a second terminal tab opening (18 & 20) located on a commutator strip (12), with commutator strip (12) having a light source (16) attached thereto;

c. bending commutator strip (12) until commutator strip (12) is substantially flush with the outside surface of fuse housing (22); and;

d. inserting prior art plug-in type fuse housing (22) with attached commutator strip (12) into the fuse box;

whereby;

when fuse (24) is functioning, light source (16) will not illuminate, and when fuse (24) is not functioning, light source (24) will illuminate, thus indicating to a user that fuse housing (22) is in need of replacement.

Although the invention has been herein shown and described in what is conceived to be the most practical and preferred embodiment, it is recognized that departures may be made therefrom within the scope and spirit of the invention, which is not to be limited to the details disclosed herein but is to be accorded the full scope of the claims so as to embrace any and all equivalent devices and apparatus's.

Having described our invention, what we claim as new and wish to secure by Letters Patent is:

1. A blown fuse commutator strip for use with a fuse having a plug-in type fuse housing comprising: a thin flexible strip of insulating plastic material having a first embedded internal filament; a second embedded internal filament; and indicator means electrically connected to said first and second filaments, said strip being of a shape and size corresponding to an outside surface of said plug-in type fuse housing, whereby:

when said strip is attached to said fuse housing, said fuse strip accommodates to the shape of said outside surface, and when said fuse housing is installed within a typical fuse block in the usual manner, said fuse housing, said fuse block and said strip in combination are in electrical communication, whereby:

when a fusible link within said fuse housing is blown, said indicator means will indicate by producing a light or a sound that said fuse needs to be replaced.

2. The commutator strip of claim 1 wherein said indicator means is a light source.

3. The commutator strip of claim 1 wherein said indicator is a buzzer.

4. The commutator strip of claim 1 wherein said commutator strip is attached to said plug-in type fuse housing by an adhesive.

5. The commutator strip of claim 1 wherein said commutator strip is of a color which corresponds to the color of said plug-in type fuse housing, whereby:

said commutator strip with said plug-in type fuse housing indicate an amperage of the fuse.

6. A method of using and attaching a blown fuse commutator strip to a fuse having a plug-in type fuse housing comprising of the following steps:

a. removing the plug-in type fuse housing from a fuse block;

b. slidably inserting both terminal tabs located on said fuse housing into a first and a second terminal tab openings located on said commutator strip, with said commutator strip having two embedded filaments and a light source attached thereto and electrically connected to said filaments;

c. bending said commutator strip until said commutator strip is substantially flush with an outside surface of said plug-in type fuse housing; and;

d. inserting said plug-in type fuse housing with attached said commutator strip into the fuse block; whereby;

when a fusible link within said plug-in type fuse housing is intact, said light source will not illuminate, and when said fusible link is blown, said light source will illuminate, thus indicating to a user that said fuse is in need of replacement.

* * * * *